(12) United States Patent
Takeda

(10) Patent No.: US 9,349,685 B2
(45) Date of Patent: May 24, 2016

(54) SEMICONDUCTOR DEVICE AND METHOD OF MANUFACTURING SEMICONDUCTOR DEVICE

(71) Applicant: FUJITSU SEMICONDUCTOR LIMITED, Yokohama-shi, Kanagawa (JP)

(72) Inventor: Shigetoshi Takeda, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/678,431

(22) Filed: Apr. 3, 2015

(65) Prior Publication Data

US 2015/0214151 A1    Jul. 30, 2015

Related U.S. Application Data

(62) Division of application No. 13/606,710, filed on Sep. 7, 2012, now Pat. No. 9,024,410.

(30) Foreign Application Priority Data

Sep. 7, 2011 (JP) ................................. 2011-194648

(51) Int. Cl.
*H01L 23/525* (2006.01)
*H01L 21/02* (2006.01)
*H01L 21/768* (2006.01)

(52) U.S. Cl.
CPC ........ *H01L 23/5256* (2013.01); *H01L 21/0217* (2013.01); *H01L 21/02164* (2013.01); *H01L 21/768* (2013.01); *H01L 2924/0002* (2013.01)

(58) Field of Classification Search
CPC .................................................... H01L 23/5256
USPC ........................................................... 438/381
See application file for complete search history.

(56) References Cited

U.S. PATENT DOCUMENTS

| 6,368,902 | B1 | 4/2002 | Kothandaraman et al. |
| 2005/0077594 | A1* | 4/2005 | Matsunaga et al. ........... 257/529 |
| 2005/0161766 | A1* | 7/2005 | Sato et al. .................... 257/529 |
| 2008/0093703 | A1 | 4/2008 | Yang et al. |

FOREIGN PATENT DOCUMENTS

| JP | 61-030060 A | 2/1986 |
| JP | 62-89338 A | 4/1987 |
| JP | 9-69570 A | 3/1997 |
| JP | 2002-057217 A | 2/2002 |
| JP | 2005-136381 A | 5/2005 |
| JP | 2007-311372 A | 11/2007 |
| JP | 2010-507256 A | 3/2010 |

OTHER PUBLICATIONS

Japanese Office Action dated Oct. 14, 2014, issued in corresponding JP Application No. 2011-194648 with English translation (5 pages).

* cited by examiner

*Primary Examiner* — Edward Wojciechowicz
(74) *Attorney, Agent, or Firm* — Westerman, Hattori, Daniels & Adrian, LLP

(57) ABSTRACT

A semiconductor device includes a first insulating film formed above a semiconductor substrate, a fuse formed above the first insulating film, a second insulating film formed above the first insulating film and the fuse and including an opening reaching the fuse, and a third insulating film formed above the second insulating film and in the opening.

12 Claims, 18 Drawing Sheets

SEMICONDUCTOR DEVICE AND METHOD OF MANUFACTURING SEMICONDUCTOR DEVICE

CROSS-REFERENCE TO RELATED APPLICATION

This application is a divisional of U.S. application Ser. No. 13/606,710, filed Sep. 7, 2012, which is based upon and claims the benefit of priority of the prior Japanese Patent Application No. 2011-194648, filed on Sep. 7, 2011, the entire contents of which are incorporated herein by reference.

FIELD

The embodiments discussed herein are related to a semiconductor device including a fuse and a method of manufacturing the same.

BACKGROUND

Reconstruction of a semiconductor device, such as characteristic adjustment in an analog circuit, rescue of a defective cell in a memory device, etc., are made by mounting in advance a fuse circuit including a plurality of fuses in the semiconductor device and disconnecting the fuses after operational tests, etc. have been made.

The fuses are of the known modes of being disconnected by explosion or sublimation by laser beam irradiation and of being fused by Joule's heat generated by current applied to the fuses, and other modes.

The mode of disconnecting the fuse by laser beam irradiation cannot be made after the package processing and is made in the wafer testing step before the package processing. In the package processing after the semiconductor device has been reconstructed in the wafer state, often the semiconductor chips are strained by the stress of the package resin, and the strain deviates the adjusted device characteristics.

On the other hand, the mode of fusing the fuse can break the fuse in a test after the packaging, and is suitable for trimming requiring high precision for, e.g., adjustment of reference potentials of analog products, etc.

The followings are examples of related: Japanese Laid-open Patent Publication No. 09-069570; and Japanese Laid-open Patent Publication No. 2005-136381.

In the mode of disconnecting the fuse by fusing, current flowed to fuse the fuse and substances around the fuse and then re-solidify the fused areas to electrically disconnect them, and the fuse cannot be sublimated as in disconnecting the fuse by laser beam irradiation. Consequently, depending on structures around the fuse and states of the re-solidified areas, the degree of the electric disconnection is not always sufficient.

SUMMARY

According to one aspect of an embodiment, there is provided a semiconductor device including a first insulating film formed above a semiconductor substrate, a fuse formed above the first insulating film, a second insulating film formed above the first insulating film and the fuse and including an opening reaching the fuse, and a third insulating film formed above the second insulating film and in the opening.

According to another aspect of an embodiment, there is provided a method of manufacturing a semiconductor device including forming a first insulating film above a semiconductor substrate, forming a fuse above the first insulating film, forming a second insulating film above the fuse and the first insulating film, forming an opening in the second insulating film to expose the fuse, and forming a third insulating film above the second insulating film and in the opening.

According to further another aspect of an embodiment, there is provided a method of manufacturing a semiconductor device including forming a first insulating film above a semiconductor substrate, forming a fuse above the first insulating film, forming a second insulating film in contact with the first insulating film above the semiconductor substrate with the fuse formed on, forming a third insulating film above the second insulating film, forming an opening in the second insulating film and the third insulating film above the fuse, and forming in the opening a fourth insulating film formed of an insulating material whose melting point is lower than a melting point of the third insulating film.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

[A First Embodiment]

A semiconductor device and a method of manufacturing the semiconductor device according to a first embodiment will be described with reference to FIGS. 1 to 7I.

Figure 1:
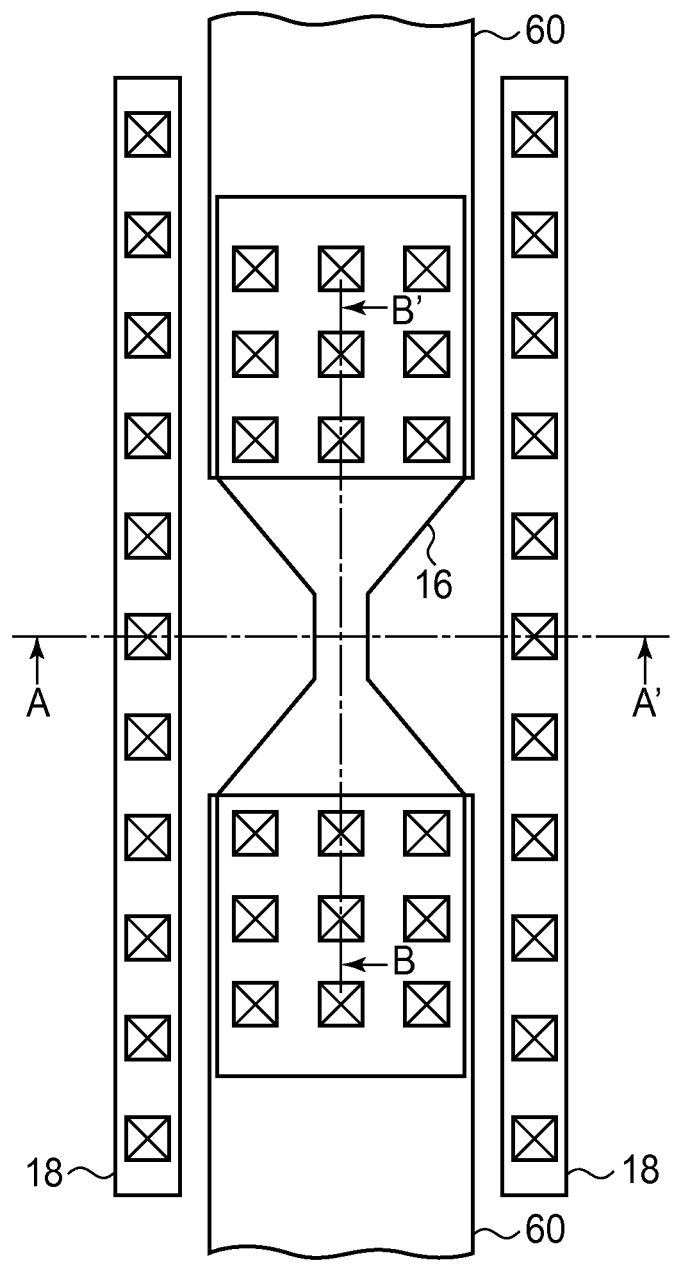
FIG. 1 is a plan view illustrating a structure of a semiconductor device according to a first embodiment.
Figure 2:
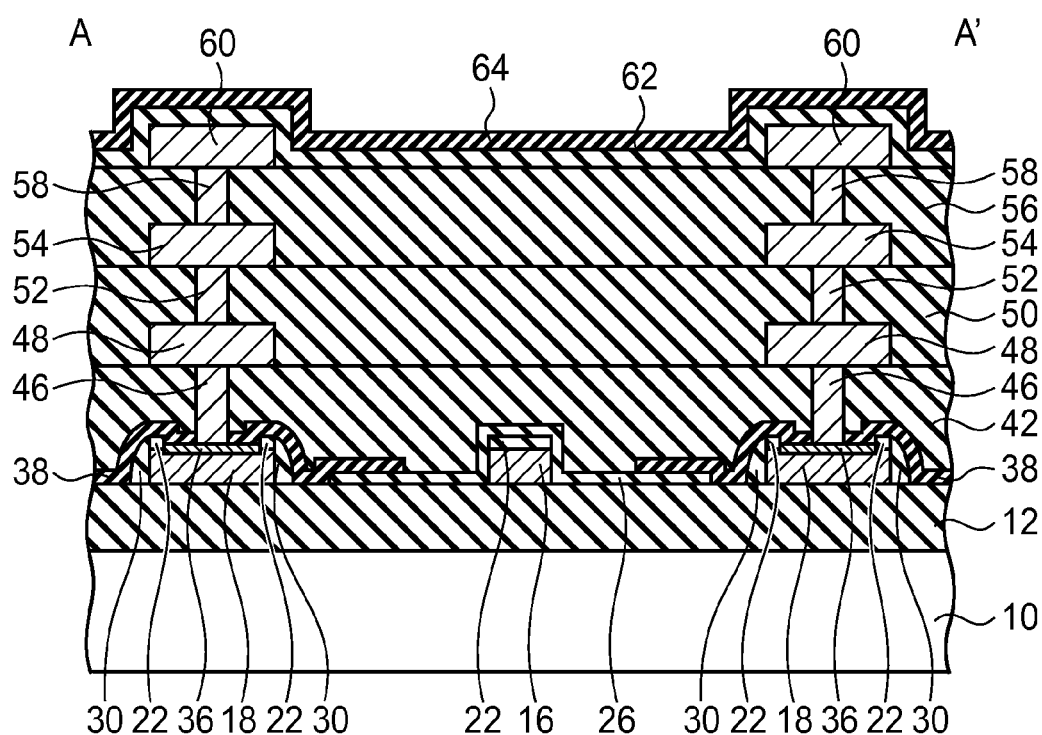
FIGS. 2 and 3 are diagrammatic cross-sectional views illustrating the structure of the semiconductor device according to the first embodiment.
Figure 3:
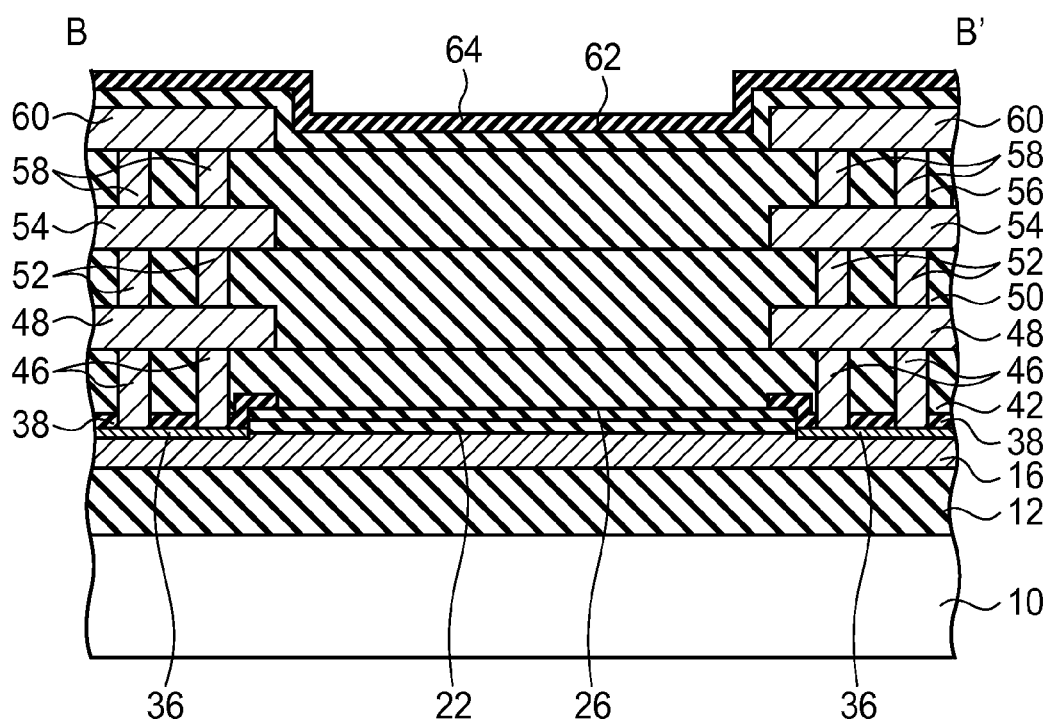
Figure 4A:
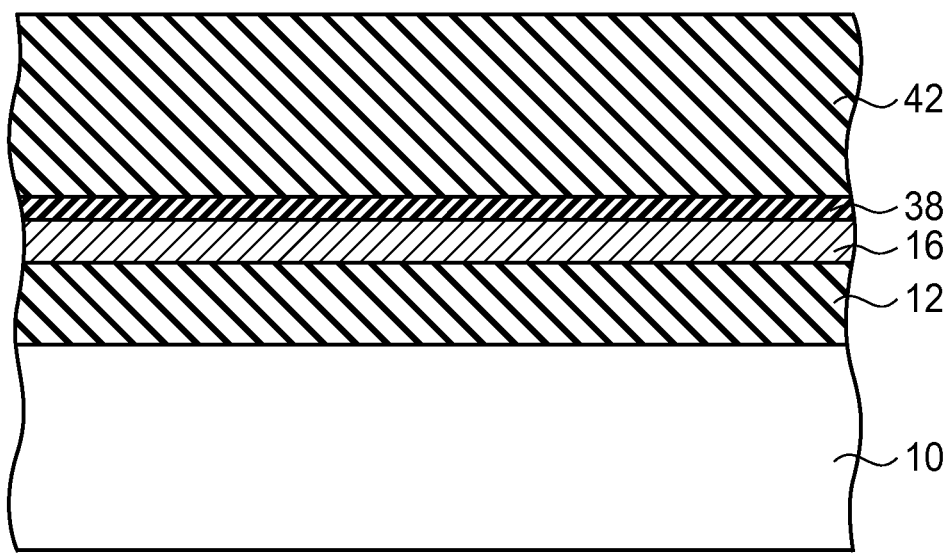
FIGS. 4A and 4B are views illustrating a problem with an etching stopper film present on a fuse.
Figure 4B:
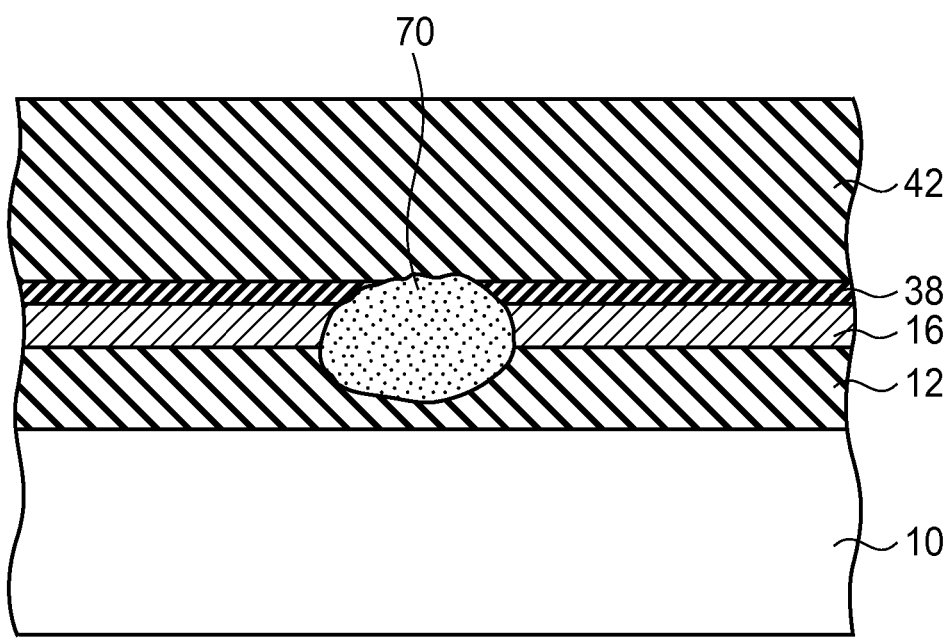

FIG. 1 is a plan view illustrating a structure of the semiconductor device according to the present embodiment. FIGS. 2 and 3 are diagrammatic cross-sectional views illustrating the structure of the semiconductor device according to the present embodiment. FIGS. 4A-4B are views illustrating a problem with an etching stopper film present on a fuse. FIGS. 5A-5K, 6A-6H and 7A-7I are cross-sectional views illustrating a method of manufacturing the semiconductor device according to the present embodiment.

First, the structure of the semiconductor device according to the present embodiment will be described with reference to FIGS. 1 to 3. FIG. 2 is the A-A' line cross-sectional views of FIG. 1, and FIG. 3 is the B-B' line cross-sectional view of FIG. 1.

A device isolation insulating film 12 is formed in a silicon substrate 10. A fuse 16 of polycrystalline silicon is formed above the device isolation insulating film 12. As illustrated in FIG. 1, the fuse 16 has a plane shape narrowed at the intermediate part. On both sides of the fuse 16, dummy interconnections 18 for preventing damages from spreading when the fuse 16 is fused. A metal silicide film 36 is formed above the surfaces of both ends of the fuse 16 and above the dummy interconnections 18. Silicon oxide films 22, 26 are formed above the region of the fuse 16, where the metal silicide film 36 is not formed.

An etching stopper film 38 and an inter-layer insulating film 42 are formed above the device isolation insulating film 12 with the fuse 16 and the dummy interconnections 18 formed on. Contact plugs 46 connected to the metal silicide film 36 are buried in the inter-layer insulating film 42 and the etching stopper film 36. Interconnection layers 48 connected to the contact plugs 46 are formed above the inter-layer insulating film 42.

An inter-layer insulating film 50 is formed above the inter-layer insulating film 42 with the interconnection layers 48 formed on. Contact plugs 52 connected to the interconnection layers 48 are buried in the inter-layer insulating film 50. Interconnection layers 54 connected to the contact plugs 52 are formed above the inter-layer insulating film 50.

An inter-layer insulating film 56 is formed above the inter-layer insulating film 50 with the interconnection layers 54 formed on. Contact plugs 58 connected to the interconnection layers 54 are buried in the inter-layer insulating film 56. Interconnection layers 60 connected to the contact plugs 58 are formed above the inter-layer insulating film 56.

A silicon oxide film 62 and a silicon nitride film 64 as a cover film are formed above the inter-layer insulating film 56 with the interconnection layers 60 formed on.

In the semiconductor device according to the present embodiment, as illustrated in FIGS. 2 and 3, the etching stopper film 38 is absent above the fuse 16. The reason for the etching stopper film 38 being absent above the fuse 16 in the semiconductor device according to the present embodiment will be described below.

Below an inter-layer insulating film of a semiconductor device, an etching stopper film of etching characteristics different from those of the inter-layer insulating film is often formed. For example, when contact holes of different depths are concurrently formed in the inter-layer insulating film, the region for the shallow contact hole to be formed in is exposed to excessive etching, and the structure at the bottom of the contact hole is often damaged. Then, the etching stopper film of etching characteristics different from those of the inter-layer insulating film is provided to thereby protect the base structure from the etching damage.

As the inter-layer insulating film, an insulating material mainly formed of silicon oxide such as silicon oxide film or others is widely used. When the inter-layer insulating film is formed of an insulating material mainly formed of silicon oxide, an insulating material mainly formed of silicon nitride, such as silicon nitride film or others is widely used as the etching stopper film for stopping the etching of the inter-layer insulating film.

However, the inventor has made studies and found that with the etching stopper film 38 present above the fuse 16, the fuse 16 cannot be fused stably with a good disconnection degree. The inventor infers that the reason why the fuse 16 cannot be fused stably is as follows.

For a semiconductor device in which trimming and redundancy are made after package processing, as described above, preferably the fuse 16 is disconnected by flowing current to the fuse 16. Such fuse 16 has the configuration having the intermediate part narrowed as exemplified in FIG. 1. When current is flowed to such fuse 16, the temperature rises due to the Joule's heat at the intermediate part where the current density goes up, and the fuse 16 and the its surrounding materials are fused. Due to the fusing of the fuse 16, the current stops flowing. The temperature goes down, and the fused part is re-solidified.

Here, the case that, as exemplified in FIG. 4A, the etching stopper film 38 of the silicon nitride film is present above the fuse 16 is assumed. Silicon nitride film of the etching stopper film 38 has a large stress applied to the silicon substrate 10 in comparison with silicon oxide film forming the inter-layer insulating films between the interconnection layers, and the device isolation insulating film 12. With the etching stopper film 38 of silicon nitride film present above the fuse 16, a compressive stress is applied to the fuse 16 from the etching stopper film 38 toward the silicon substrate 10.

When the fuse 16 is disconnected in this state, the stress applied by the etching stopper film 38 suppresses the effect of increase of the volume by fusing the fuse 16 and its surroundings. Resultantly, the fused region 70 is made smaller, and the gaps between the fragments of the polycrystalline silicon, the fuse material, which are re-solidified, becomes small, and the electric disconnection degree is worsened (refer to FIG. 4B). The decrease of the fused region 70 might be also due to the higher melting point of silicon nitride than that of silicon oxide.

From this view point, in the semiconductor device according to the present embodiment, the etching stopper film 38 above the fuse 16 is selectively removed. The etching stopper film 38 above the fuse 16 is removed, whereby the fused region 70 can be widened without the influence of a stress from the etching stopper film 38. Thus, the fuse 16 can be fused stably with a good disconnection degree.

It is not necessary to remove the etching stopper film 38 from the entire surface of the fuse 16. The etching stopper film 38 is removed at least from the part of the fuse 16, where the fuse 16 is fused when the fuse 16 is disconnected, i.e., the narrowed part of the fuse 16, which is at the intermediate part of the fuse 16.

Next, a method of manufacturing the semiconductor device according to the present embodiment will be described with reference to FIGS. 5A to 7I. FIGS. 5A to 5K are the A-A' line cross-sectional views of the semiconductor device in the steps of the semiconductor device manufacturing method. FIGS. 6A to 6H are B-B' line cross-sectional views of the semiconductor device in the steps of the semiconductor device manufacturing method. FIGS. 7A to 7I are sectional views of the semiconductor device in the steps of the semiconductor device manufacturing method in the transistor forming region.

Figure 5A:
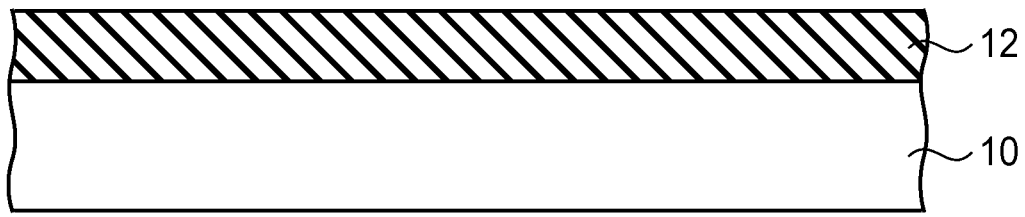
FIGS. 5A-5K, 6A-6H and 7A-7I are cross-sectional views illustrating a method of manufacturing the semiconductor device according to the first embodiment.
Figure 6A:
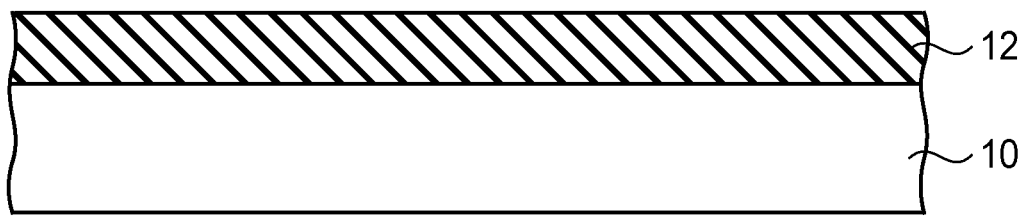
Figure 7A:
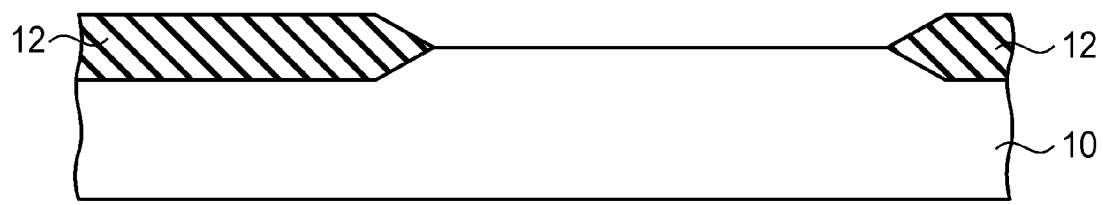

First, the device isolation insulating film 12 defining active regions is formed in the silicon substrate 10 by, e.g., LOCOS (LOCal Oxidation of Silicon) method. The device isolation insulating film 12 is so formed here that the fuse 16 is formed above the device isolation insulating film 12 (FIGS. 5A, 6A and 7A). The device isolation insulating film 12 may be formed by STI (Shallow Trench Isolation) method.

Then, above the active region of the silicon substrate 10 defined by the device isolation insulating film 12, a gate insulating film 14 of, e.g., silicon oxide film is formed by, e.g., thermal oxidation method.

Next, a polycrystalline silicon film and a silicon oxide film are sequentially formed above the entire surface by, e.g., CVD (chemical vapor deposition) method.

Then, by photolithography and dry etching, the silicon oxide film and the polycrystalline silicon film are patterned to form the fuse 16, the dummy interconnections 18 and a gate electrode 20 which have the upper surfaces covered by the silicon oxide film 22.

Figure 5B:
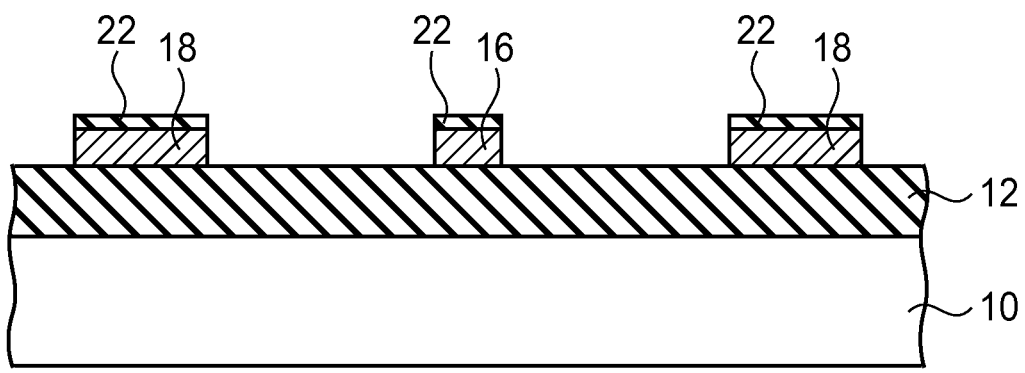
Figure 6B:
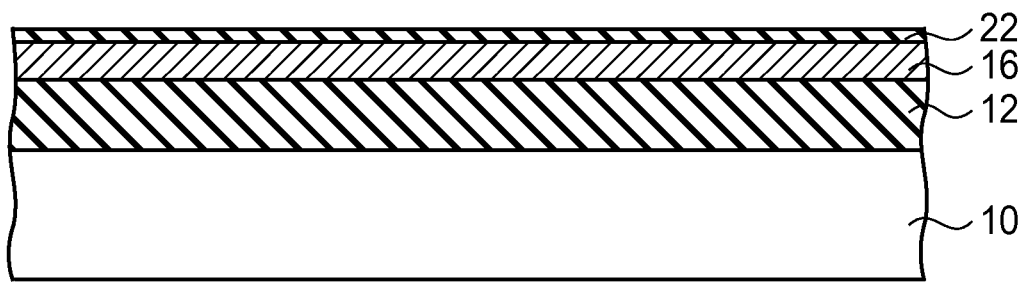
Figure 7B:
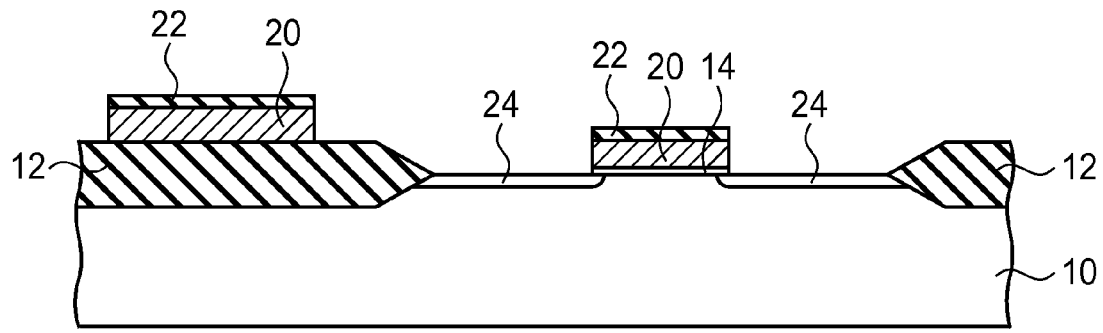

Then, ion implantation is made with the gate electrode 20 as the mask to form impurity diffused regions 24 to be the LDD regions or the extension regions in the silicon substrate 10 on both sides of the gate electrode 20 (FIGS. 5B, 6B and 7B).

The silicon oxide film 22 is to be used to prevent the silicidation in a later step. In forming the metal silicide film 36 above the entire upper surface of the gate electrode 20, when the metal silicide film 36 is not used, it is not essential to form the silicon oxide film 22. When the silicon oxide film 22 is not formed, a silicon oxide film 26 to be formed in a later step can be used to block the silicidation of the region of the fuse 16.

Next, a silicon oxide film 26 is formed above the entire surface by, e.g., CVD method.

Figure 5C:
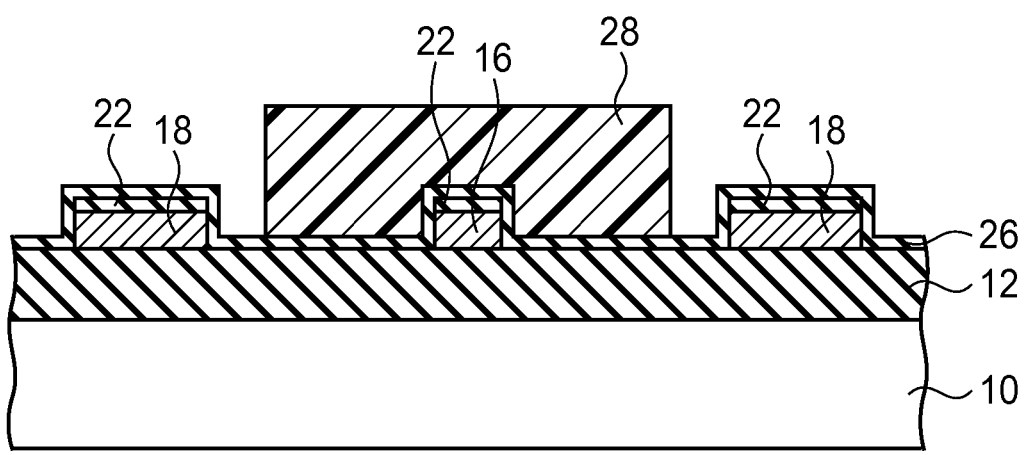
Figure 6C:
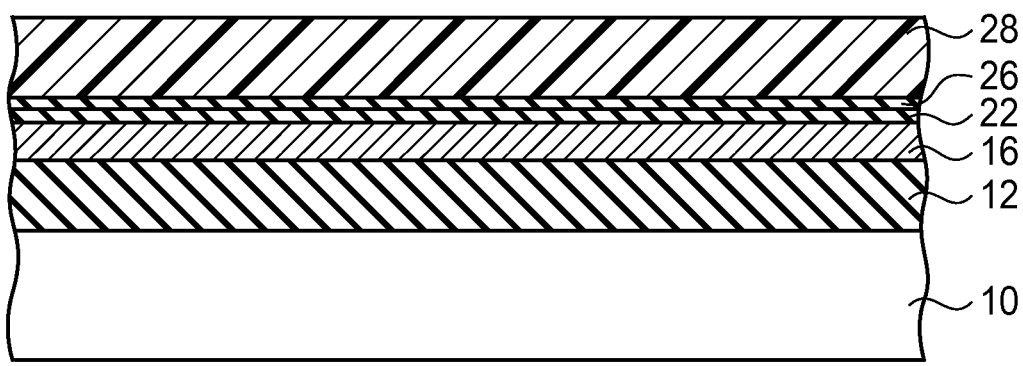
Figure 7C:
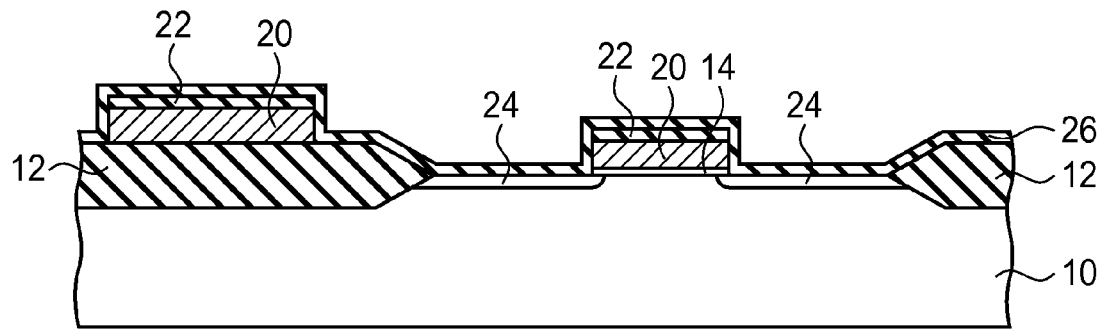

Then, by photolithography, a photoresist film 28 covering the fuse 16 and exposing the rest region is formed (FIGS. 5C, 6C and 7C).

Next, with the photoresist film 28 as the mask, the silicon oxide film 26 is anisotropically etched to be left, covering the fuse 16 while forming sidewall insulating films 30 thereof on the side walls of the dummy interconnections 18 and the gate electrode 20.

Next, the photoresist film 28 is removed by, e.g., asking method.

Figure 5D:
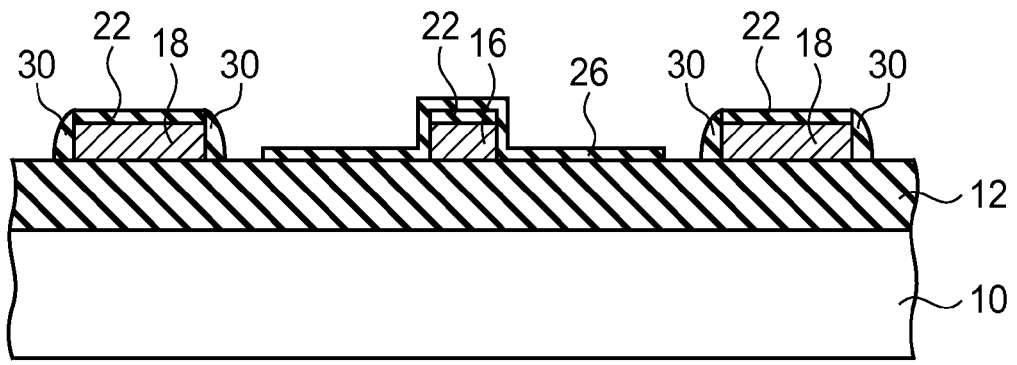
Figure 7D:
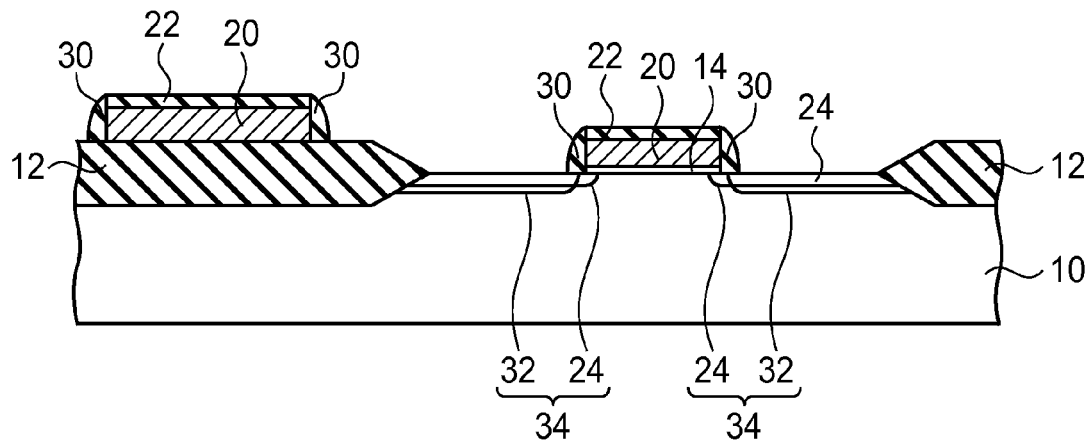

Then, with the gate electrode 20 and the sidewall insulating film 30 as the mask, ion implantation is made to from impurity diffused regions 32 in the silicon substrate 10 on both side of the gate electrode 20. Thus, source/drain regions 34 including the impurity diffused regions 24, 32 are formed (FIGS. 5D and 7D).

Figure 5E:
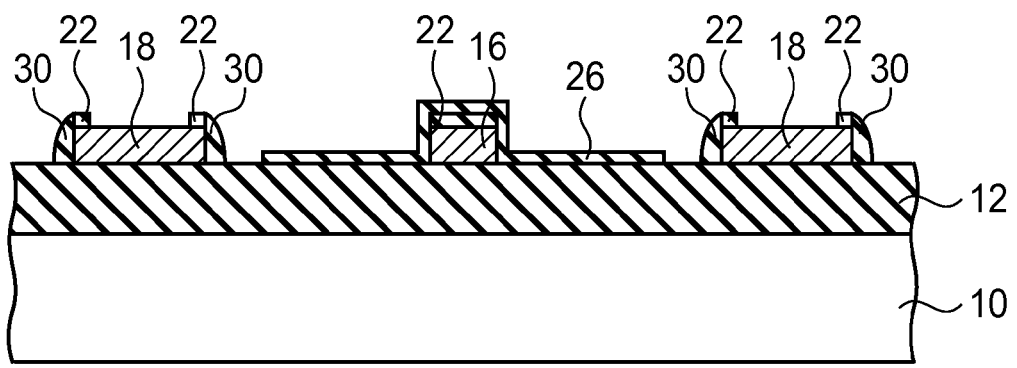
Figure 6D:
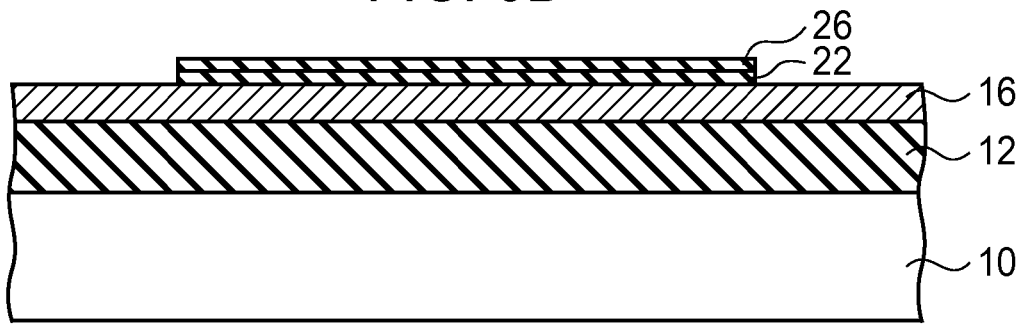
Figure 7E:
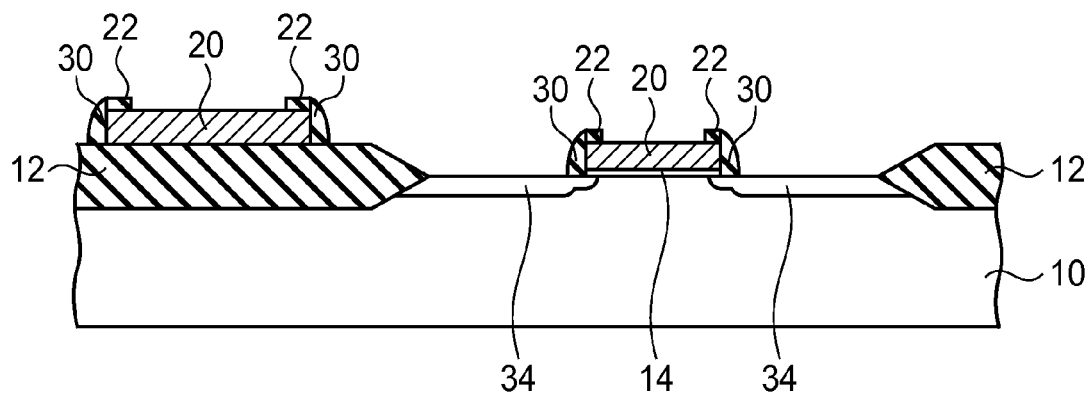

Then, by photolithography and dry etching, the silicon oxide films 22, 26 are patterned to expose the silicide forming regions of the fuse 16, dummy interconnections 18 and the gate electrode 20 (FIGS. 5E, 6D and 7E). In the fuse 16 and the dummy interconnections 18, contact regions which connect interconnection layers to be connected to the fuse 16 and the dummy interconnections 18 are exposed.

Figure 5F:
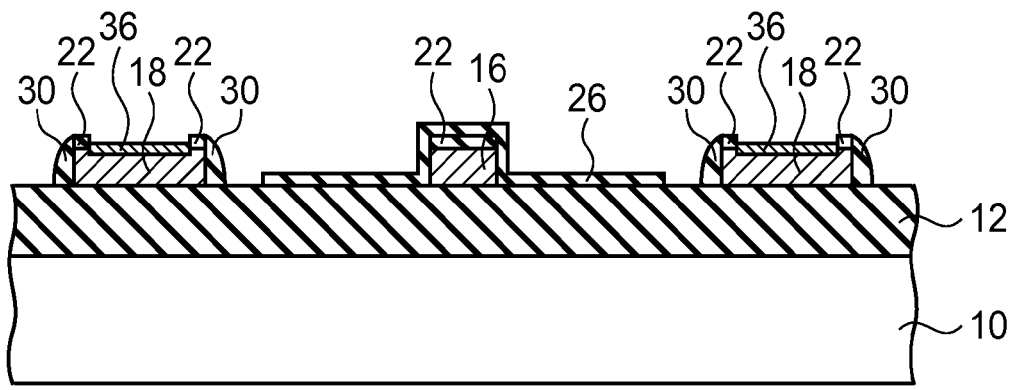
Figure 6E:
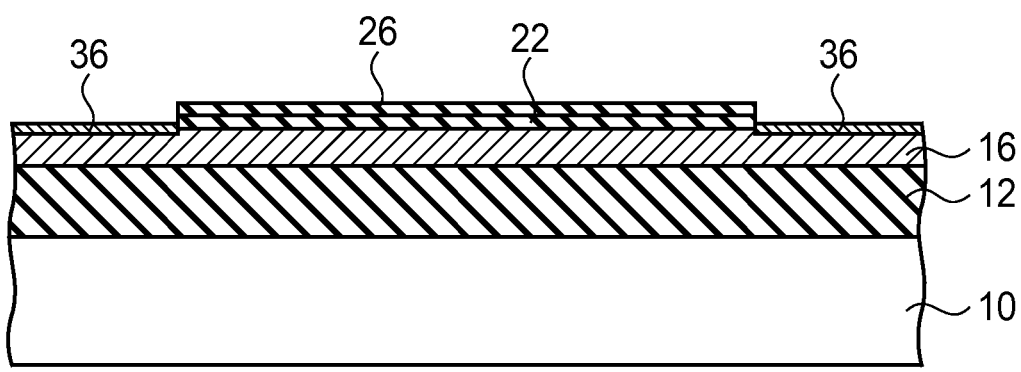
Figure 7F:
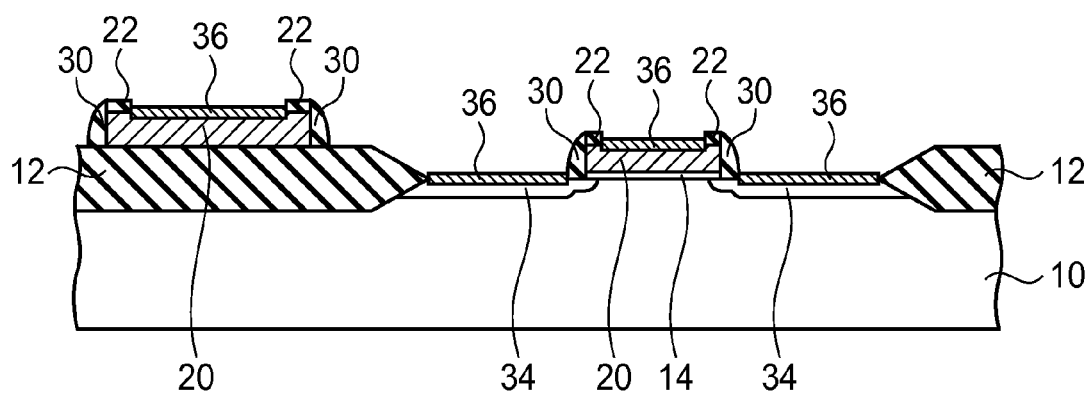

Next, the metal silicide film 36 is formed by salicide (self-aligned silicide) process as required selectively in the exposed parts of the fuse 16, the dummy interconnections 18 and gate electrode 20 (FIGS. 5F, 6E and 7F). At this time, the silicon oxide films 22, 26 formed above the fuse 16 function as the silicide block insulating film.

Figure 5G:
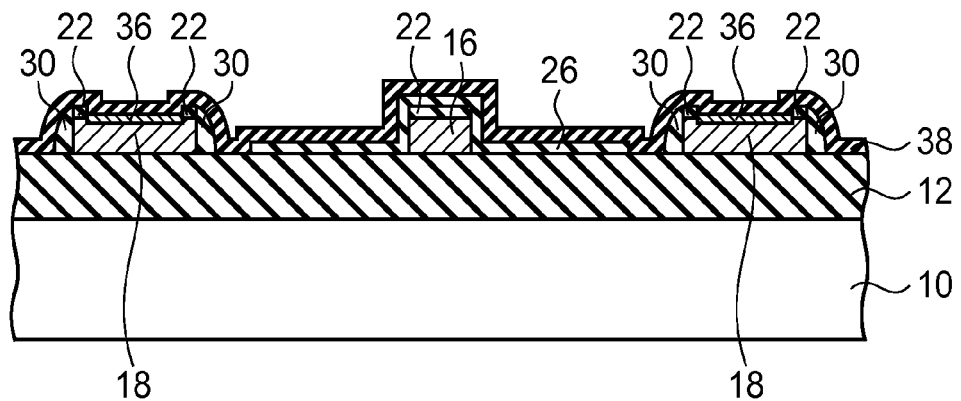
Figure 7G:
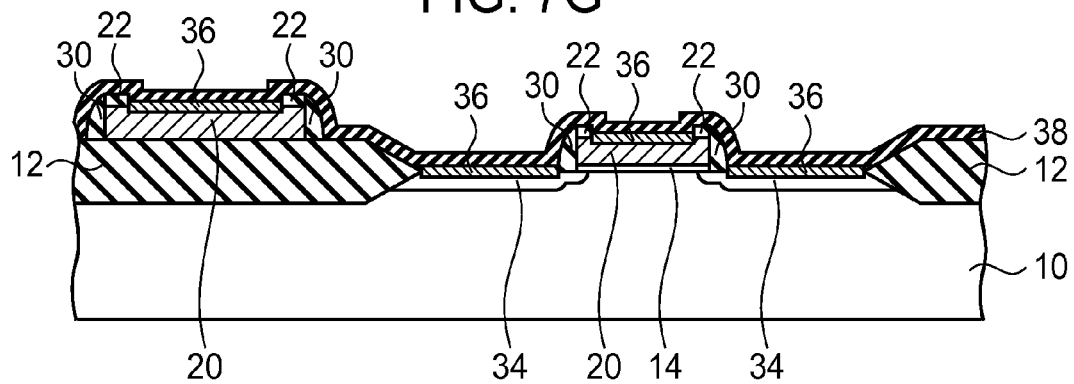

Then, a silicon nitride film is deposited above the entire surface by, e.g., CVD method to form the etching stopper film 38 of silicon nitride film (FIGS. 5G and 7G). The etching stopper film 38 is a film which mitigates etching damage to be applied to the base and is formed ordinarily in contact with the base to be protected from etching (e.g., the device isolation insulating film 12, the gate electrode 20 including the metal silicide film 36, the source/drain regions 34, etc.).

Next, by photolithography, a photoresist film 40 exposing the region for the fuse 16 formed in, at least the region containing the region where the fuse 16 will be fused and covering the rest region is formed.

Figure 5H:
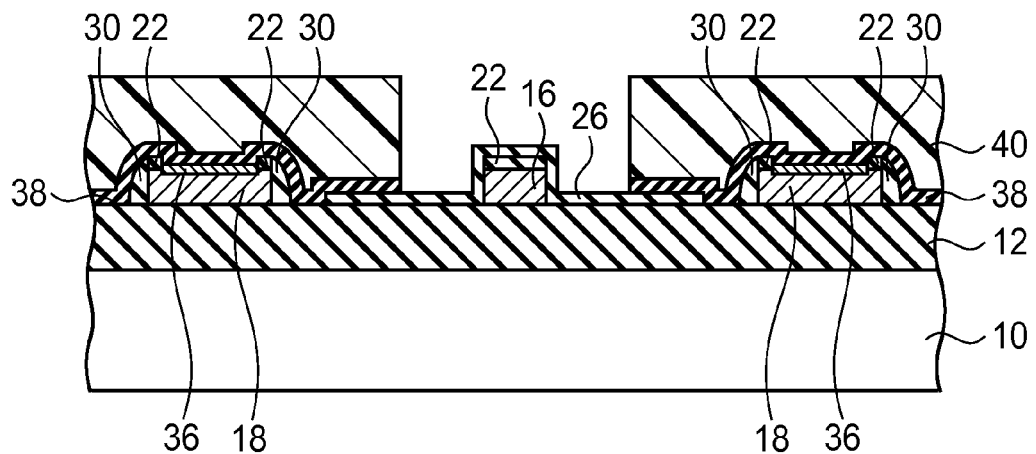
Figure 6F:
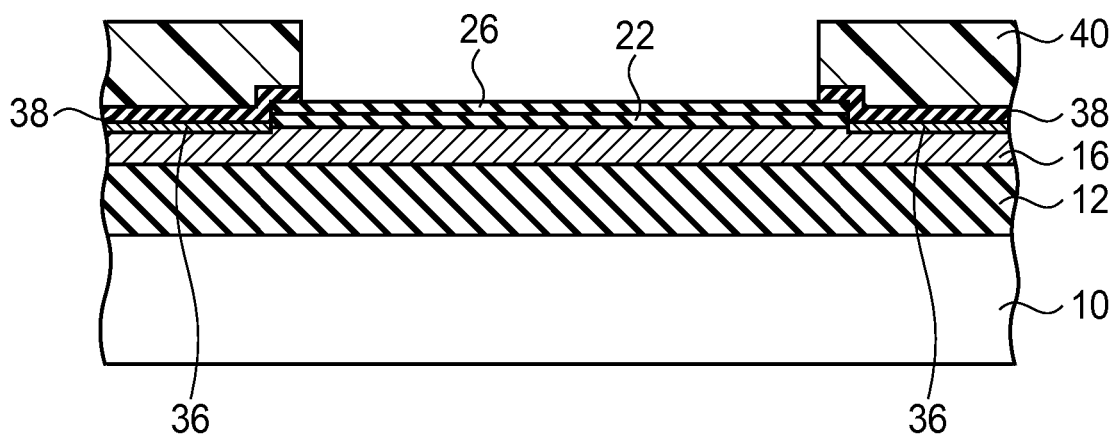

Then, with the photoresist film 40 as the mask and with the etching stopper film 38 as the stopper, the etching stopper film 38 is dry etched to form an opening in the etching stopper film 38 above the fuse 16 (FIGS. 5H and 6F).

The etching stopper film 38 is etched here with the silicon oxide film 26 as the stopper but cannot be etched essentially with the silicon oxide film 26 are the stopper. When the silicon oxide film 22 is used for the silicide block for the fuse 16 or the metal silicide film is not used, the silicon oxide film 26 is not essentially formed.

Next, the photoresist film 40 is removed by, e.g., asking method.

Figure 5I:
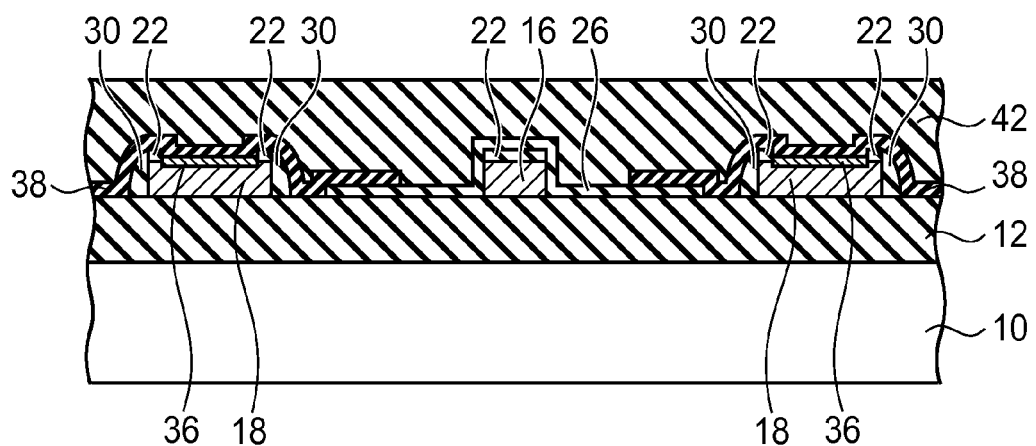
Figure 7H:
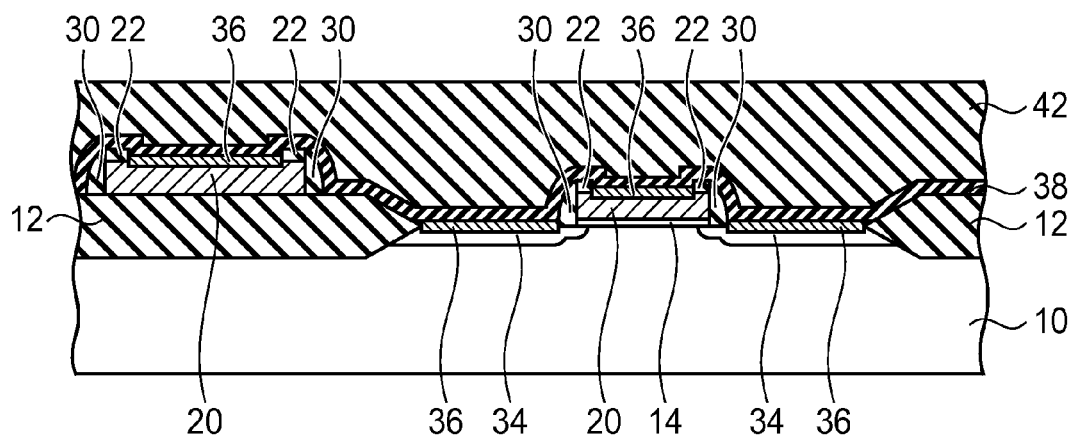

Then, a silicon oxide film is deposited above the entire surface by, e.g., CVD method to form the inter-layer insulating film 42 of silicon oxide film (FIGS. 5I and 7H).

Next, by photolithography and dry etching, the contact holes 44 down to the metal silicide film 36 on the fuse 16, the dummy interconnections 18, the gate electrode 20 and the source/drain regions 34 are formed in the inter-layer insulating film 42 and the etching stopper film 38.

At this time, the contact hole 44 opened above the gate electrode 20 and the contact holes 44 opened above the source/drain regions 34 have depths different from each other, but the etching stopper film 38 below the inter-layer insulating film 42 can prevents the gate electrode 20 from being exposed to excessive etching.

Then, a conductive film is deposited above the entire surface, and the conductive film is etched back to form the contact plugs 46 buried in the contact holes 44.

Figure 5J:
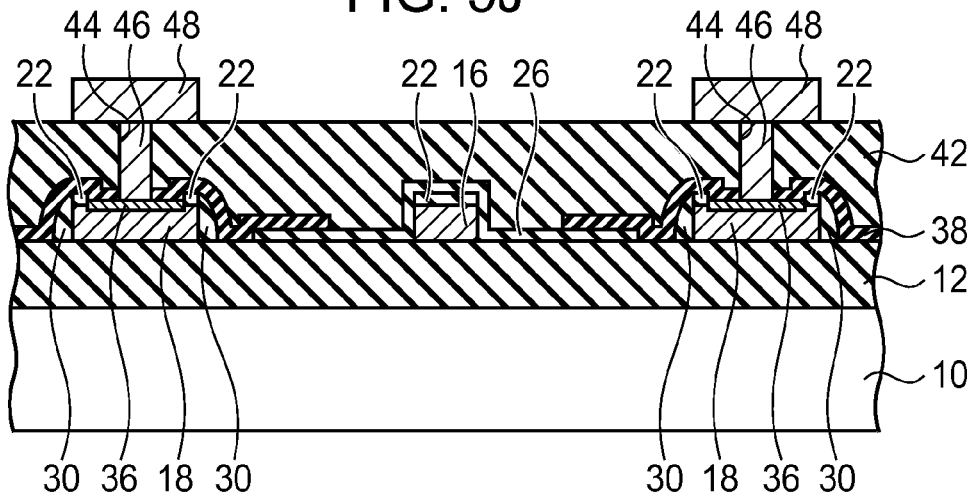
Figure 6G:
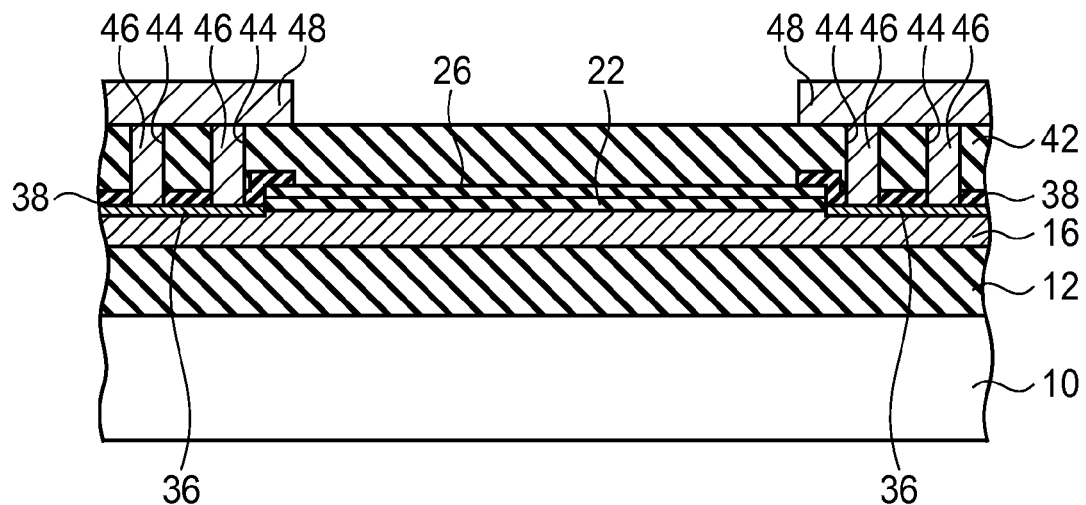
Figure 7I:
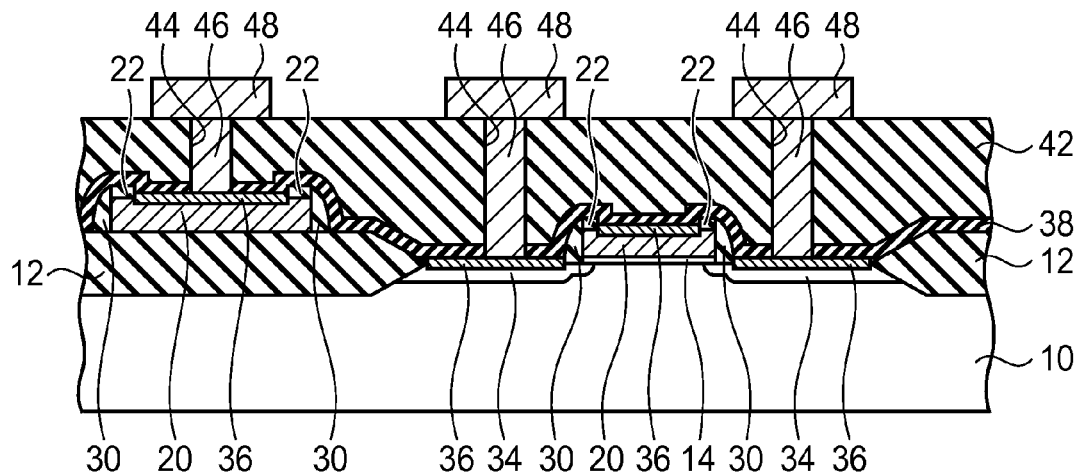

Next, a conductive film is deposited above the inter-layer insulating film 42 with the contact plugs 46 buried in, and the conductive film is patterned. Thus, the interconnection layers 48 electrically connected to the fuse 16, the dummy interconnections 18, the gate electrode and the source/drain regions 34 via the contact plugs 46 are formed (FIGS. 5J, 6G and 7I).

Next, in the same way, the inter-layer insulating film 50, the contact plugs 52, the interconnection layers 54, the inter-layer insulating film 56 the contact plugs 58 and the interconnection layers 60 are sequentially formed, and the interconnection layer structure of a required layer number is formed.

Figure 5K:
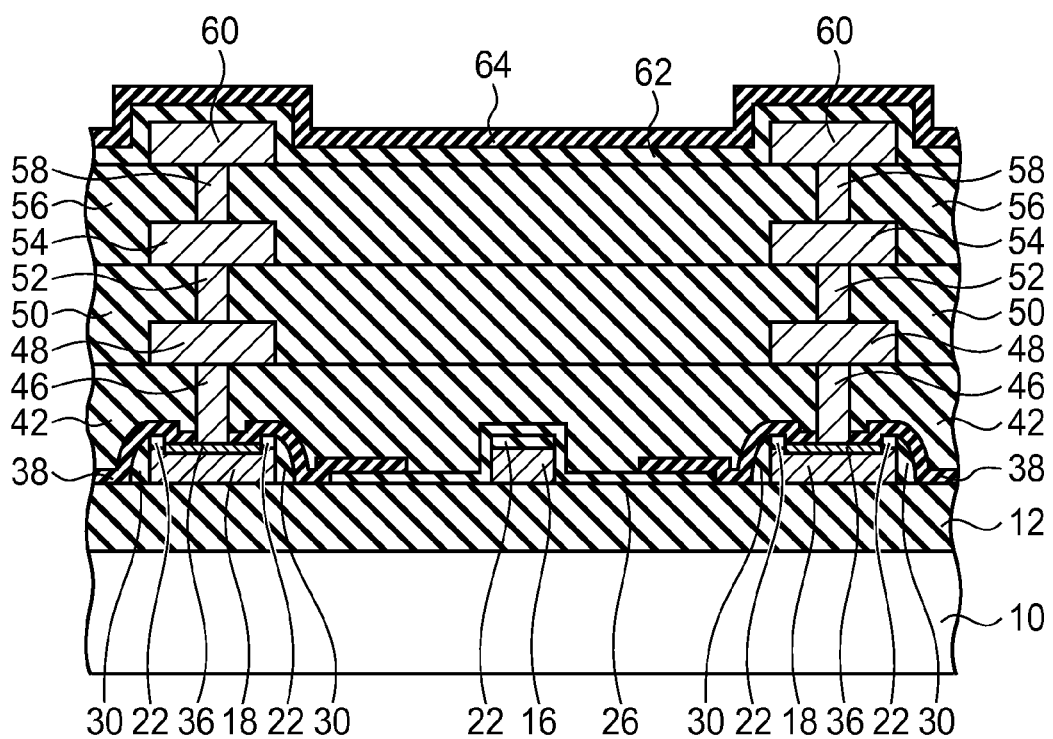
Figure 6H:
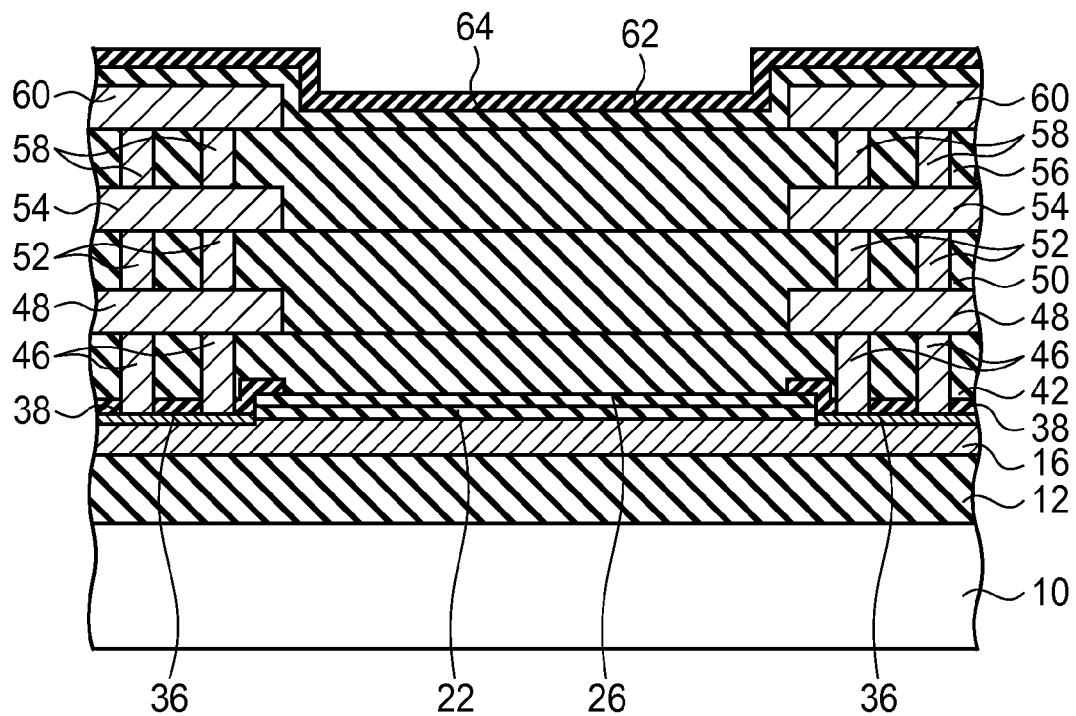

Then, above the inter-layer insulating film 56 with the interconnection layers 60 formed on, a silicon oxide film 62 and a silicon nitride film 64 as a cover film are formed, and a string of wafer processes is completed (FIGS. 5K and 6H).

Next, the semiconductor substrate 10 which has been subjected to the above-described string of wafer processes is subjected to dicing and packaged.

Next, a circuit test is made on the packaged semiconductor device to detect whether required circuit characteristics have been provided. When the required circuit characteristics have not been provided, required fuses are disconnected for trimming or redundancy.

In the semiconductor device according to the present embodiment, the etching stopper film 38 above the fuse has been removed, whereby the fuse can be stably and surely disconnected. The circuit test and the trimming are made after packaged, whereby even when device characteristics have been deviated due to a stress of the package resin, the trimming of high precision including the deviation can be made, and a semiconductor device having a small characteristic deviation can be manufactured.

As described above, according to the present embodiment, the etching stopper film above the fuse is removed, the fuse of the fusing mode can be stably and surely disconnected. The circuit test and the trimming are made after packaged, whereby even when device characteristics have been deviated due to a stress of the package resin, the trimming of high precision including the deviation can be made, and a semiconductor device having a small characteristic deviation can be manufactured.

[A Second Embodiment]

A semiconductor device and a method of manufacturing the semiconductor device according to a second embodiment will be described with reference to FIGS. 8 to 9C. The same members of the present embodiment as those of the semiconductor device and the method of manufacturing the same according to the first embodiment illustrated in FIGS. 1 to 7I are represented by the same reference numbers not to repeat or to simplify the description.

Figure 9A:
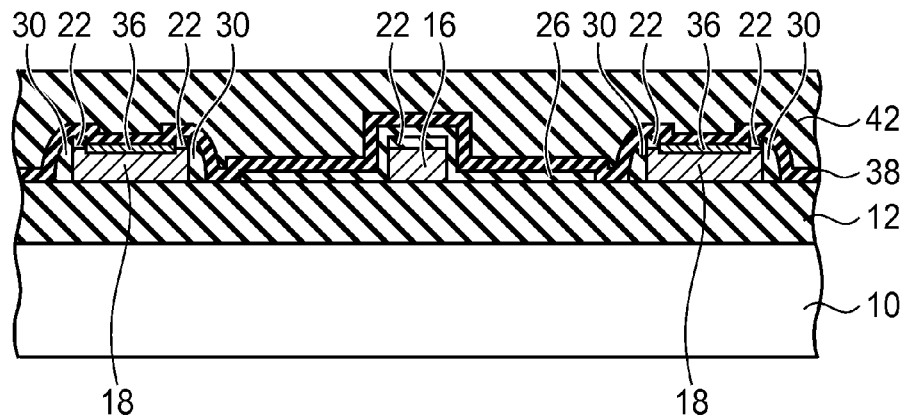
FIGS. 9A-9C are cross-sectional views illustrating a method of manufacturing the semiconductor device according to the second embodiment.
Figure 9B:
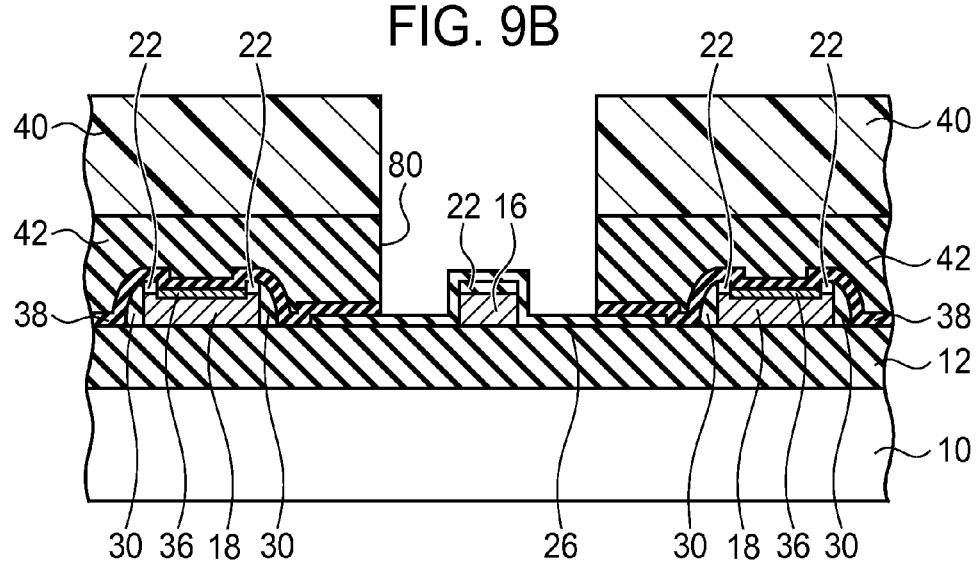

FIG. 15 is a cross-sectional view illustrating a structure of the semiconductor device according to the present embodiment. FIGS. 9A-9C are cross-sectional views illustrating the method of manufacturing the semiconductor device according to the present embodiment.

First, the structure of the semiconductor device according to the present embodiment will be described with reference to FIG. 8.

Figure 8:
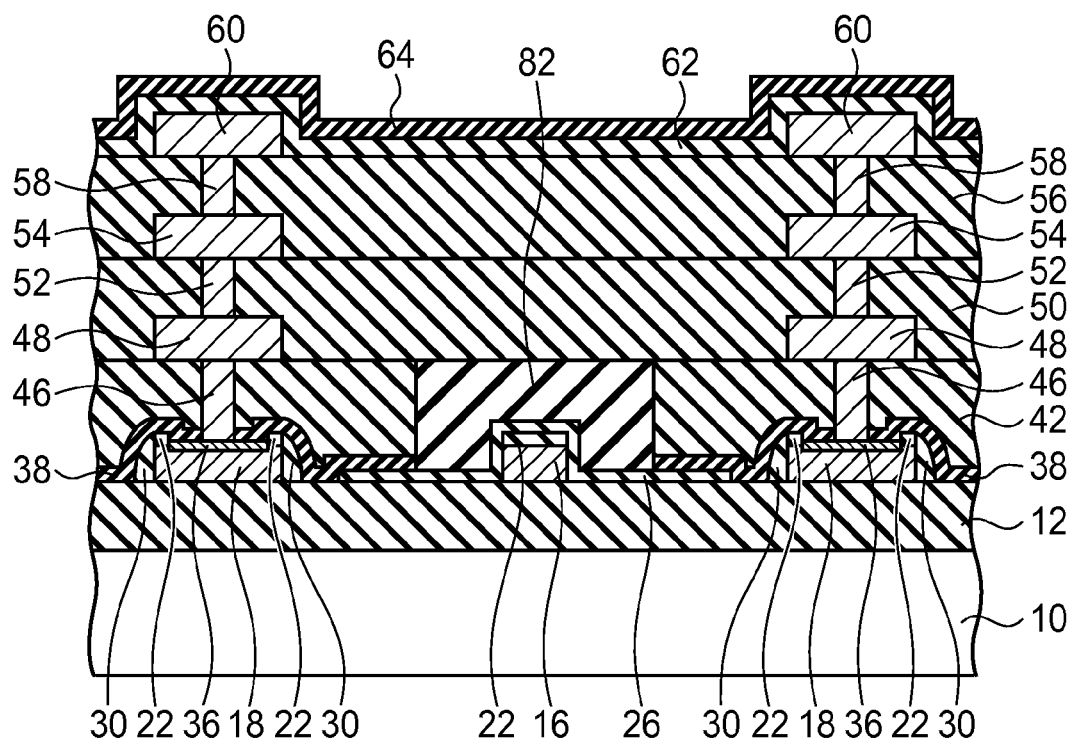
FIG. 8 is a diagrammatic cross-sectional view illustrating a structure of a semiconductor device according to a second embodiment.

In the semiconductor device according to the present embodiment, as illustrated in FIG. 8, the etching stopper film 38 above the fuse 16 is removed, and the inter-layer insulating film 42 in the region where the etching stopper film 38 is removed is replaced by a low melting point insulating film 82 of an insulating material having a lower melting point than the inter-layer insulating film 42.

The low melting point insulating film 82 whose melting point is lower than the melting point of the inter-layer insulating film 42 is formed around the fuse 16, whereby the fusion upon a disconnection of the fuse takes place in a wider area, and the electric disconnection degree can be further improved.

The material of the low melting point insulating film 82 is not specifically limited as long as the melting point of the material is lower than that of the inter-layer insulating film 42. For example, silicon oxide containing impurity, such as BPSG, PSG, BSG, AsAG, etc., spin-on type insulating material, such as SOG or others can be used.

Next, the method of manufacturing the semiconductor device according to the present embodiment will be described with reference to FIGS. 9A-9C.

First, in the same way as in the method of manufacturing the semiconductor device according to the first embodiment as exemplified in FIGS. 5A to 5G, the structure up to the etching stopper film 38 is formed.

Then, above the etching stopper film 38, a silicon oxide film is deposited by, e.g., CVD method to form the inter-layer insulating film 42 of silicon oxide film (FIG. 9A).

Next, a photoresist film 40 exposing the region for the fuse 16 formed in, at least the region containing the region where the fuse 16 will be fused and covering the rest region is formed above the inter-layer insulating film 42 by photolithography.

Then, with the photoresist film 40 as the mask, the inter-layer insulating film 42 and the etching stopper film 38 are dry etched to form an opening 80 in the etching stopper film 38 and the inter-layer insulating film 42 (FIG. 9B). The opening 80 can be formed also in the silicon oxide film 26 by etching the silicon oxide film 26 with the photoresist film 40 as the mask.

Next, the photoresist film 40 is removed by, e.g., asking method.

Then, a BPSG film, for example, is deposited above the entire surface by, e.g., CVD method to form the low melting point insulating film 62 on the inter-layer insulating film 42.

Figure 9C:
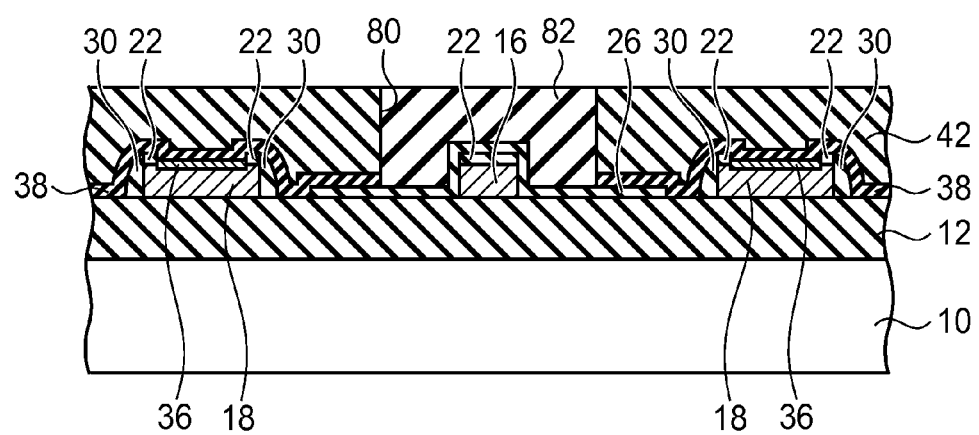

Next, the low melting point insulating film 82 above the inter-layer insulating film 42 is removed by etching back or CMP (chemical mechanical polishing) method to be left selectively in the opening 80 (FIG. 9C).

Hereafter, in the same way as in the method of manufacturing the semiconductor device according to the first embodiment as exemplified in FIGS. 5J to 5K, the interconnection layers, the cover film, etc. are formed, and the semiconductor device is completed.

As described above, according to the present embodiment, the etching stopper film above the fuse is removed, whereby the fuse of the fusing mode can be disconnected stably and surely. Especially, the insulating material of a melting point lower than that of the inter-layer insulating film is formed around the fuse, whereby the fused region can be further widened, and the fuse can be disconnected more stably and surely.

[A Third Embodiment]

A semiconductor device and a method of manufacturing the semiconductor device according to a third embodiment will be described with reference to FIGS. 10 to 11C. The same members of the present embodiment as those of the semiconductor device and the method of manufacturing the same according to the first and the second embodiments illustrated in FIGS. 1 to 9C are represented by the same reference numbers not to repeat or to simplify the description.

Figure 10:
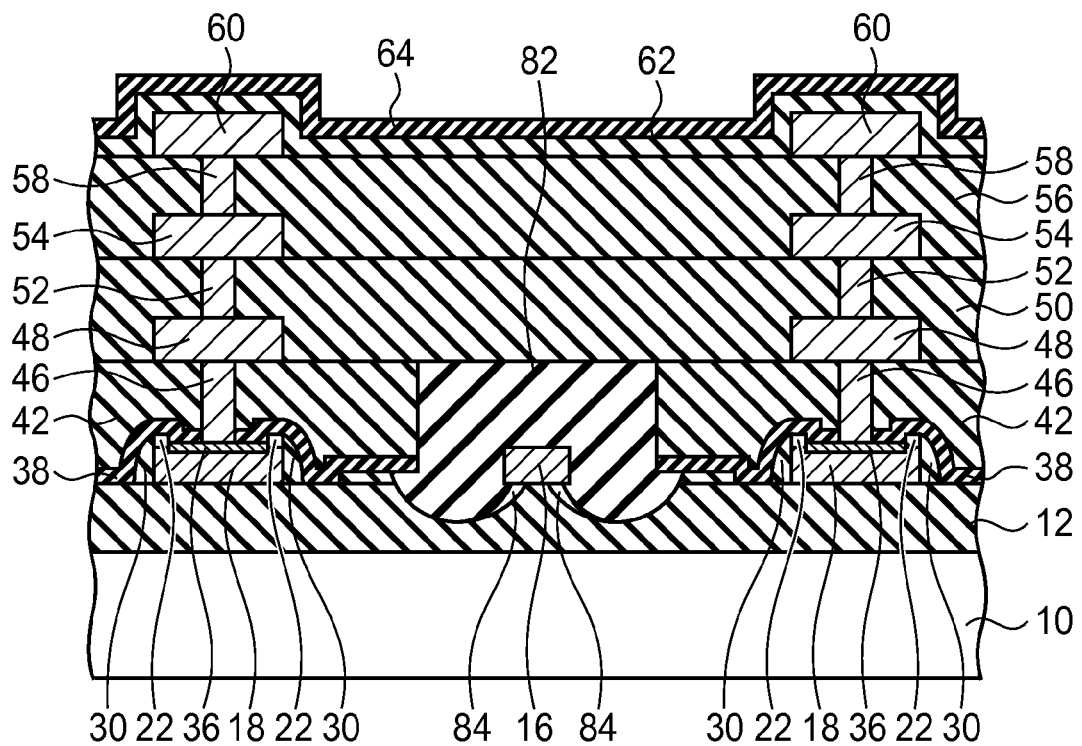
FIG. 10 is a diagrammatic cross-sectional view illustrating a structure of a semiconductor device according to a third embodiment.
Figure 11A:
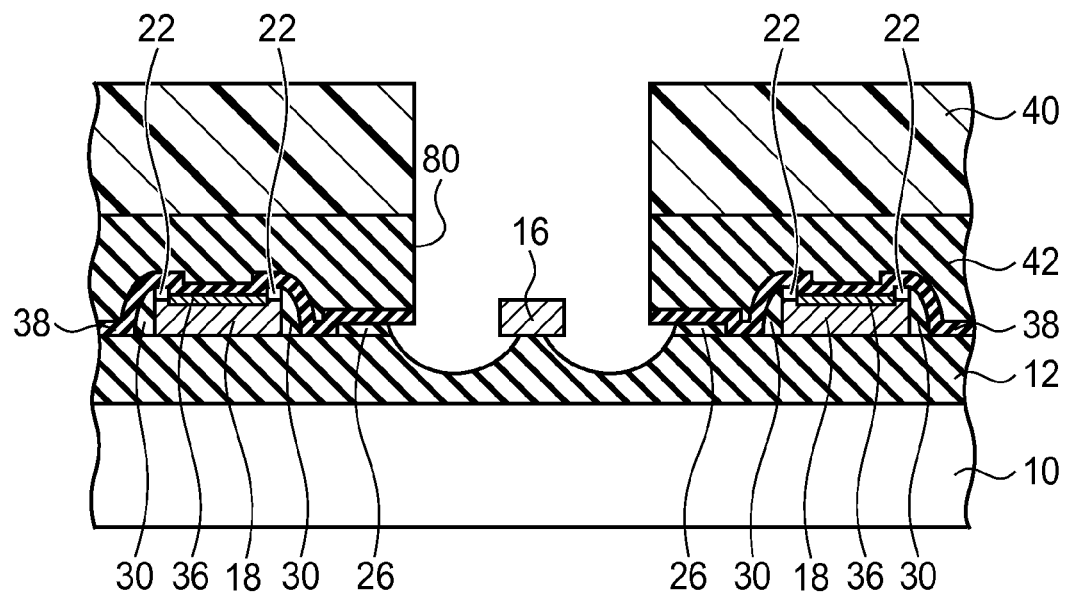
FIGS. 11A-11B are cross-sectional views illustrating a method of manufacturing the semiconductor device according to the third embodiment.
Figure 11B:
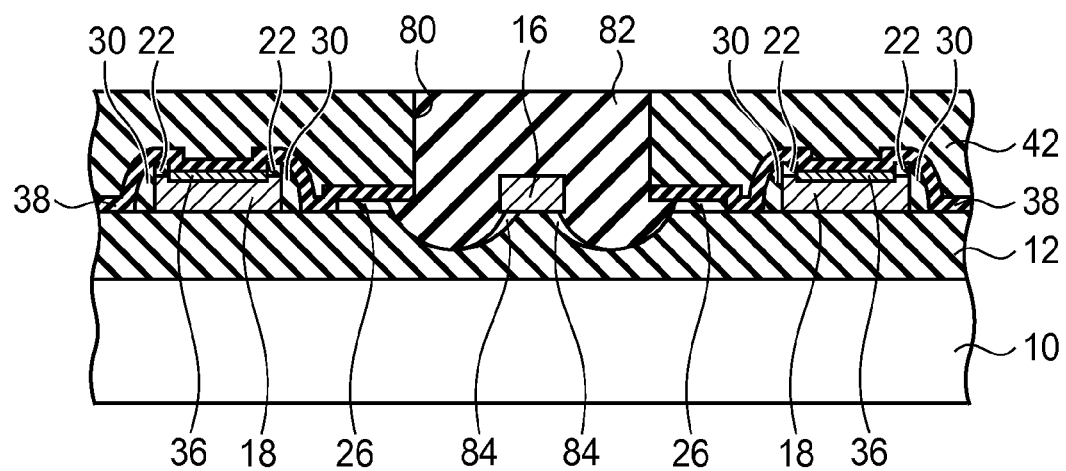

FIG. 10 is a diagrammatic cross-sectional view illustrating a structure of the semiconductor device according to the present embodiment. FIGS. 11A-11C are cross-sectional views illustrating the method of manufacturing the semiconductor device according to the present embodiment.

First, the structure of the semiconductor device according to the present embodiment will be described with reference to FIG. 10.

In the semiconductor device according to the present embodiment, as illustrated in FIG. 10, the etching stopper film 38 above the fuse 16 is removed, and the silicon oxide films 22, 26, the inter-layer insulating film 42 and the device isolation insulating film 12 around the fuse 16 are replaced by the low melting point insulating film of a lower melting point insulating material. Gaps 84 are defined between the device isolation insulating film 12 and the low melting point insulating film 82 below the fuse 16.

The low melting point insulating film 82 whose melting point is lower than those of the silicon oxide films 22, 26, the inter-layer insulating film 42 and the device isolation insulating film 12 is formed around the fuse 16, whereby the fused region upon a disconnection of the fuse 16 is further widened, and the electric disconnection degree can be further improved.

Because of the gaps 84, when the fuse 16 is disconnected, the polycrystalline silicon forming the fuse 16 can diffuse into the gaps 84, whereby the ability of the disconnection can be further improved.

Next, the method of manufacturing the semiconductor device according to the present embodiment will be describe with reference to FIGS. 11A to 11C.

First, in the same way as in the method of manufacturing the semiconductor device according to the second embodiment illustrated in FIGS. 9A to 9B, a photoresist film 40 exposing the region for the fuse 16 formed in is formed above the inter-layer insulating film 42.

Next, with the photoresist film 40 as the mask, the inter-layer insulating film 42 and the etching stopper film 38 are dry etched to form the opening 80 down to the inter-layer insulating film 42.

Next, with the photoresist film 40 as the mask, the silicon oxide films 26, 22 and the device isolation insulating film 12 are etched by isotropic etching having selectivity to the material of the fuse 16, e.g., wet etching using, e.g., hydrofluoric acid aqueous solution. Thus, the opening 80 turning in below the fuse 16 is formed (FIG. 11A).

Next, the photoresist film 40 is removed by, e.g., asking method.

Then, a BPSG film, for example, is deposited above the entire surface by, e.g., CVD method to form the low melting point insulating film 82 of BPSG. At this time, because of the fuse 16 extending in the opening 80 in the shape of eaves, the regions below the fuse 16 are not completely buried by the low melting point insulating film 82, and the gaps 84 remain.

Next, the low melting point insulating film 82 above the inter-layer insulating film 42 is removed by etching back or CMP method to leave the low melting point insulating film 82 in the opening 80 (FIG. 11B).

Hereafter, in the same way as in the method of manufacturing the semiconductor device according to the first embodiment exemplified in FIGS. 5J to 5K, the interconnection layers, the cover film, etc. are formed, and the semiconductor device is completed.

As described above, according to the present embodiment, the etching stopper film above the fuse is removed, whereby the fuse of the fusing mode can be stable and surely broken. Especially, the gaps are provided around the fuse, whereby the fused region can be easily widened, and the fuse can be disconnected further stably and surely.

[Modified Embodiments]

The above-described embodiments can cover other various modifications.

For example, in the above-described embodiments, the fuse 16 is formed of the gate electrode layer but cannot be essentially formed of the gate electrode layer. The fuse 16 can be formed of the polycrystalline silicon layer or others which are above the gate electrode layer.

In the above-described embodiments, the etching stopper film is formed of, e.g., silicon nitride based insulating materials. It is not essential that the etching stopper film is formed of a silicon nitride based insulating material. The advantageous effect of the above-described embodiments can be expected in cases that the etching stopper film is formed of a material which applies a larger stress to the silicon substrate than the other inter-layer insulating films or the etching stopper film is formed of a material whose melting point is higher than those of the other inter-layer insulating films.

In the third embodiment described above, the low melting point insulating film 82 is formed, leaving the gaps 84 in the regions below the fuse 16, but it is not essential to leave the gaps 84. The low melting point insulating film 82 is formed, merely surrounding the fuse 16, whereby the fused region upon a disconnection of the fuse 16 is extended in a wide area, and the electric disconnection degree can be further improved.

In the third embodiment described above, the low melting point insulating film 82 is formed, leaving the gaps 84 in the regions below the fuse 16, but the ordinary silicon oxide film in place of the low melting point insulating film 82 may be buried in. The gaps 84 are merely formed below the fuse 16, whereby when the fuse 16 is disconnected, the polycrystalline silicon forming the fuse 16 can diffuses also in the gaps 84, and the ability of the disconnection can be improved.

The structures, the constituent material, manufacturing conditions, etc. described in the above embodiments are only one example and can be modified or changed suitably in accordance with common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    forming a first insulating film above a semiconductor substrate;
    forming a fuse above the first insulating film;
    forming a fourth insulating film on the first insulating film and the fuse, whole of the side surface of the fuse being covered by a part of the fourth insulating film;
    forming a second insulating film above the fuse and the first insulating film;
    forming an opening through the second insulating film and above the fuse, the opening exposing the part of the fourth insulating film; and
    forming a third insulating film above the second insulating film and in the opening, whole of the part of the fourth insulating film being covered by the third insulating film.

2. The method of manufacturing a semiconductor device according to claim 1, wherein
    a melting point of the third insulating film is lower than a melting point of the second insulating film.

3. The method of manufacturing a semiconductor device according to claim 1, wherein
    a stress the second insulating film applies to the semiconductor substrate is larger than a stress the first insulating film and the third insulating film apply to the semiconductor substrate.

4. The method of manufacturing a semiconductor device according to claim 1, wherein
    the second insulating film is an etching stopper film, and
    the third insulating film is an inter-layer insulating film.

5. The method of manufacturing a semiconductor device according to claim 1, wherein
    the second insulating film is formed of an insulating material mainly formed of silicon nitride, and
    the third insulating film is formed of an insulating material mainly formed of silicon oxide.

6. A method of manufacturing a semiconductor device comprising:
    forming a first insulating film above a semiconductor substrate;
    forming a fuse above the first insulating film;
    forming a fifth insulating film on the first insulating film and the fuse, whole of the side surface of the fuse being covered by a part of the fifth insulating film;
    forming a second insulating film in contact with the first insulating film above the semiconductor substrate and above the fuse;
    forming a third insulating film above the second insulating film;
    forming an opening through the second insulating film and the third insulating film and above the fuse, the opening exposing the part of the fifth insulating film; and
    forming in the opening a fourth insulating film formed of an insulating material whose melting point is lower than a melting point of the third insulating film.

7. The method of manufacturing a semiconductor device according to claim 6, wherein
the fourth insulating film is formed of silicon oxide containing impurity, or SOG.

8. The method of manufacturing a semiconductor device according to claim 6, wherein
in forming the opening, the second insulating film and the third insulating film is etched, and thereafter the first insulating film is isotropically etched to form the opening, the opening further exposing an underside of the fuse.

9. The method of manufacturing a semiconductor device according to claim 8, wherein
in forming the fourth insulating film, the fourth insulating film is not formed below the underside of the fuse to form a gap below the underside of the fuse.

10. The method of manufacturing a semiconductor device according to claim 6, wherein
a stress the second insulating film applies to the semiconductor substrate is larger than a stress the first insulating film and the third insulating film apply to the semiconductor substrate.

11. The method of manufacturing a semiconductor device according to claim 6, wherein
the second insulating film is an etching stopper film, and the third insulating film is an inter-layer insulating film.

12. The method of manufacturing a semiconductor device according to claim 6, wherein
the second insulating film is formed of an insulating material mainly formed of silicon nitride, and
the third insulating film is formed of an insulating material mainly formed of silicon oxide.

\* \* \* \* \*